(12) United States Patent
Wang et al.

(10) Patent No.: US 12,507,356 B2
(45) Date of Patent: Dec. 23, 2025

(54) WATERPROOF DEVICE

(71) Applicant: WISTRON NEWEB CORPORATION, Hsinchu (TW)

(72) Inventors: Chien-Jung Wang, Hsinchu (TW); Bo-Yen Chen, Hsinchu (TW); Yung-Yu Chen, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 195 days.

(21) Appl. No.: 18/505,149

(22) Filed: Nov. 9, 2023

(65) Prior Publication Data

US 2024/0244775 A1    Jul. 18, 2024

(30) Foreign Application Priority Data

Jan. 12, 2023   (TW) ................................. 112101271

(51) Int. Cl.
*H05K 5/02* (2006.01)
*H05K 5/06* (2006.01)

(52) U.S. Cl.
CPC ........... *H05K 5/0217* (2013.01); *H05K 5/061* (2013.01)

(58) Field of Classification Search
CPC ........ H05K 5/0217; H05K 5/061; H05K 5/02; H05K 5/06

USPC .......................................................... 174/50
See application file for complete search history.

(56) References Cited

U.S. PATENT DOCUMENTS

2009/0255703 A1* 10/2009 Vigorito ................. H02G 3/081
174/67

FOREIGN PATENT DOCUMENTS

DE          102008058322 A1 *  5/2010  ............. F16J 15/062

* cited by examiner

*Primary Examiner* — Timothy J Thompson
*Assistant Examiner* — Guillermo J Egoavil
(74) *Attorney, Agent, or Firm* — McClure, Qualey & Rodack, LLP

(57) ABSTRACT

A waterproof device includes a first housing, a second housing, a seal, and at least one locking element. The first housing has an opening and at least one first screwing hole. The at least one first screwing hole is disposed at a periphery of the opening. The second housing covers the opening. The second housing has at least one second screwing hole. An aperture of the at least one second screwing hole is greater than an aperture of the at least one first screwing hole. The seal is disposed along an edge of the opening. When the second housing covers the opening, the second housing presses against the seal to sandwich the seal between the first housing and the second housing. The at least one locking element passes through the at least one second screwing hole and is locked at the at least one first screwing hole.

10 Claims, 8 Drawing Sheets

WATERPROOF DEVICE

CROSS-REFERENCE TO RELATED PATENT APPLICATION

This application claims the benefit of priority to Taiwan Patent application Ser. No. 11/210,1271, filed on Jan. 12, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a waterproof device, and more particularly to a waterproof device capable of enhancing waterproof performance.

BACKGROUND OF THE DISCLOSURE

In the related art, a waterproof product usually has a design having a waterproof structure with a seal, such as an O-ring. For example, a housing of the waterproof product is composed of an upper cover and a lower cover, and the seal is disposed at the junction of the upper cover and the lower cover to prevent water vapor from penetrating. Generally, the upper cover and the lower cover are assembled by screw locking. However, the torsion force generated by screws during locking may cause a deviated assembly and result in insufficient interference of the O-ring, thereby leading to water seepage. In addition, the waterproof product will be deformed as a result of thermal expansion, so as to cause slight deformation of the upper cover, the lower cover, or the O-ring. Accordingly, when the upper cover and the lower cover are forcibly fixed together by using the screws, the upper cover, the lower cover, and the O-ring cannot maintain a good fit for interference due to deformation, such that gaps that allow moisture to penetrate are formed.

Therefore, how to design a waterproof structure to ensure that the upper cover and the lower cover are not excessively restricted by screws through improvements in structural design has become an important issue to be addressed in the art.

SUMMARY OF THE DISCLOSURE

In response to the above-referenced technical inadequacy, the present disclosure provides a waterproof device to address the inadequacy of poor waterproof performance as a result of screw locking.

In one aspect, the present disclosure provides a waterproof device. The waterproof device includes a first housing, a second housing, a seal, and at least one locking element. The first housing has an opening and at least one first screwing hole, and the at least one first screwing hole is disposed at a periphery of the opening. The second housing covers the opening along a first direction. The second housing has at least one second screwing hole, the at least one first screwing hole corresponds to the at least one second screwing hole, and an aperture of the at least one second screwing hole is greater than an aperture of the at least one first screwing hole. The seal is disposed along an edge of the opening. When the second housing covers the opening, the second housing presses the seal along a second direction to sandwich the seal between the first housing and the second housing. The first direction is different from the second direction. The at least one locking element passes through the at least one second screwing hole and is locked at the at least one first screwing hole.

Therefore, in the waterproof device provided by the present disclosure, by virtue of "the at least one first screwing hole corresponding to the at least one second screwing hole, and an aperture of the at least one second screwing hole being greater than an aperture of the at least one first screwing hole" and "the at least one locking element passing through the at least one second screwing hole and being locked at the at least one first screwing hole," the at least one locking element and the second housing can be not in contact with each other when assembled, so as to avoid deviation of the first housing, the second housing, and the seal when the at least one locking element is locked. In addition, since the at least one locking element and the second housing is not in contact with each other when assembled, the second housing and the at least one locking element have a gap therebetween to accommodate the deformation caused by thermal expansion, such that the seal can be kept closely fitted between the first and second housings and a good waterproof performance can be maintained.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
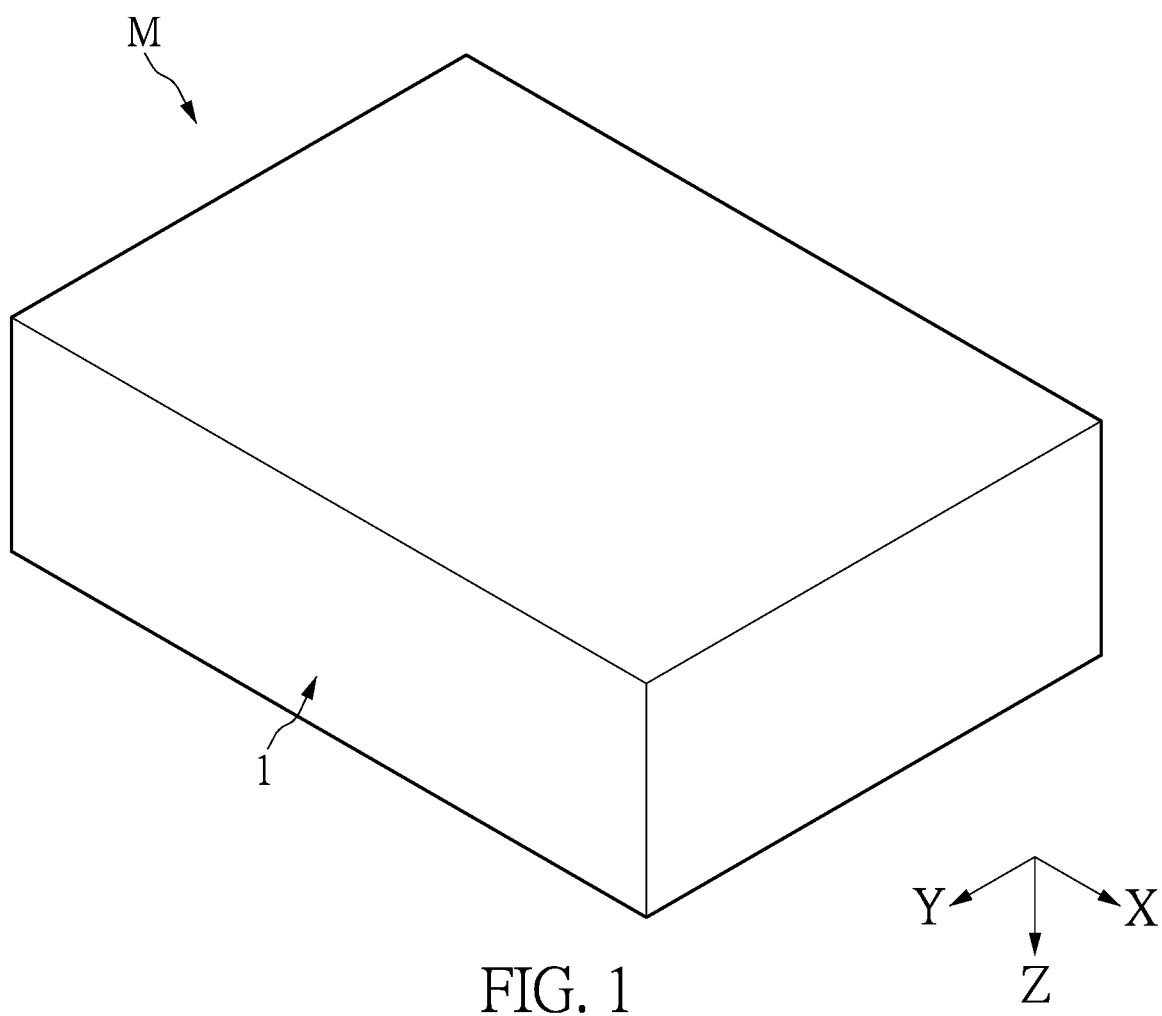
FIG. 1 is a schematic perspective view of a waterproof device according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Embodiments

Figure 2:
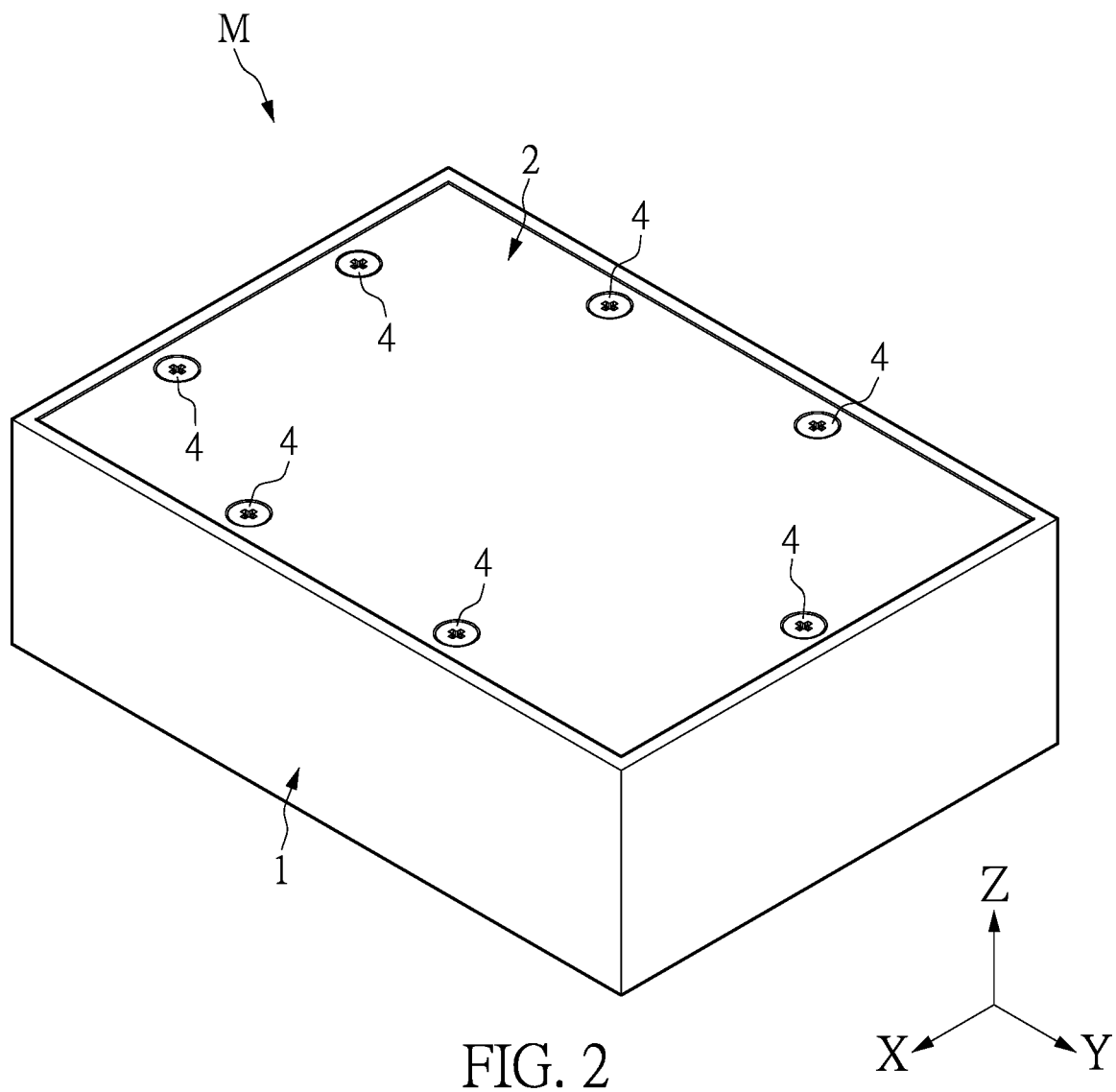
FIG. 2 is another schematic perspective view of the waterproof device according to the present disclosure.
Figure 3:
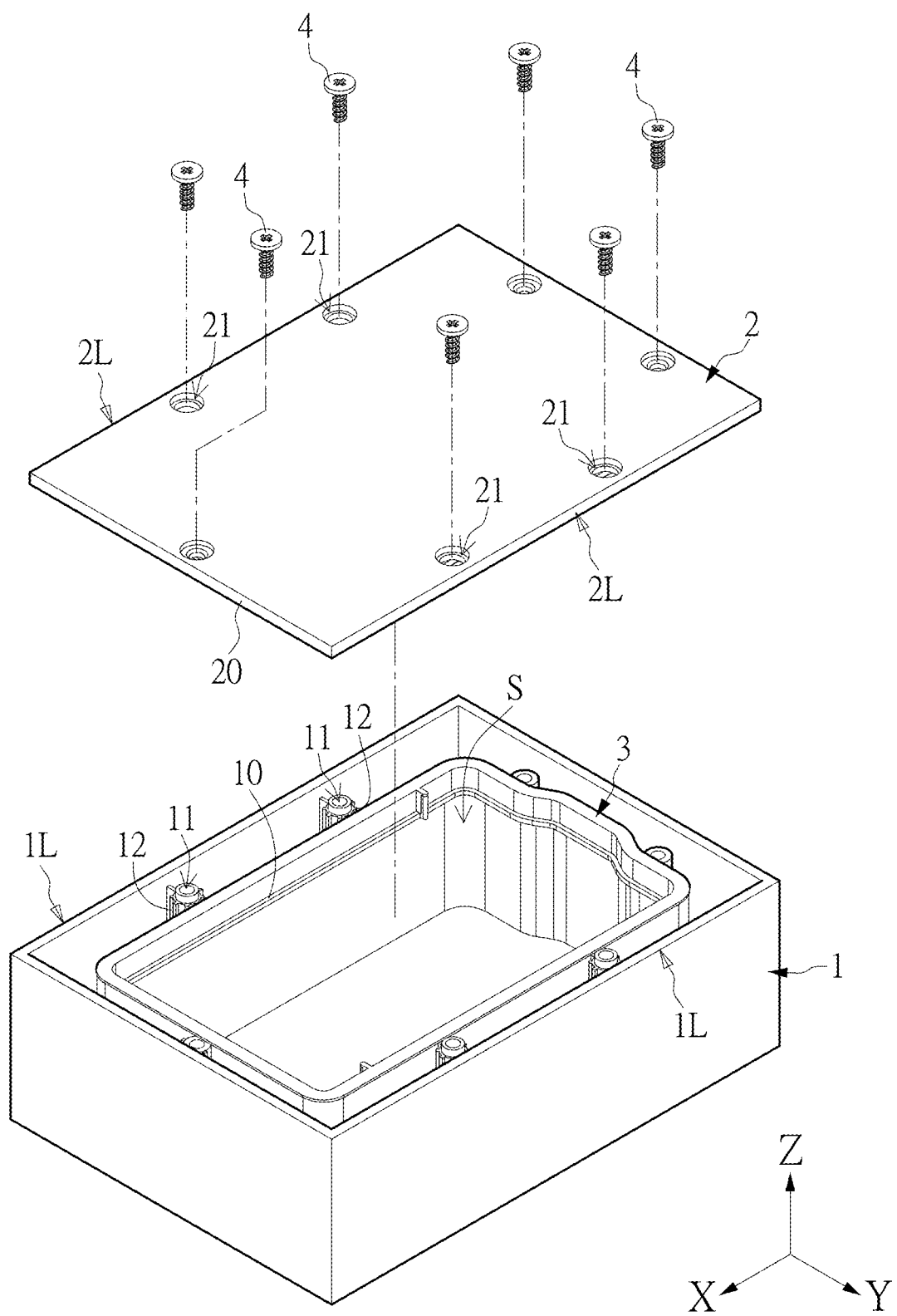
FIG. 3 is a schematic exploded view of the waterproof device according to the present disclosure.

Referring to FIG. 1 to FIG. 3, FIG. 1 and FIG. 2 are schematic perspective views of a waterproof device according to the present disclosure, and FIG. 3 is a schematic exploded view of the waterproof device according to the present disclosure. The present disclosure provides a waterproof device M that includes a first housing 1, a second housing 2, a seal 3, and at least one locking element 4. For example, the at least one locking element 4 can be a screw. The first housing 1 has an opening S and at least one first locking element 11. The at least one first screwing hole 11 is disposed at a periphery of the opening S. The second housing 2 covers the opening S along a negative Z-axis direction. The second housing 2 has at least one second screwing hole 21, and the at least one first screwing hole 11 corresponds to the at least one second screwing hole 21. The seal 3 is disposed along an edge of the opening S and is located between the first housing 1 and the second housing 2. A shape of the seal 3 is not limited in the present disclosure. For example, in this embodiment, the seal 3 can be an annular seal, such as an O-ring. In other embodiments, the seal 3 can have a rectangular shape. The at least one locking element 4 passes through the at least one second screwing hole 21 and is locked at the at least one first screwing hole 11.

Figure 4:
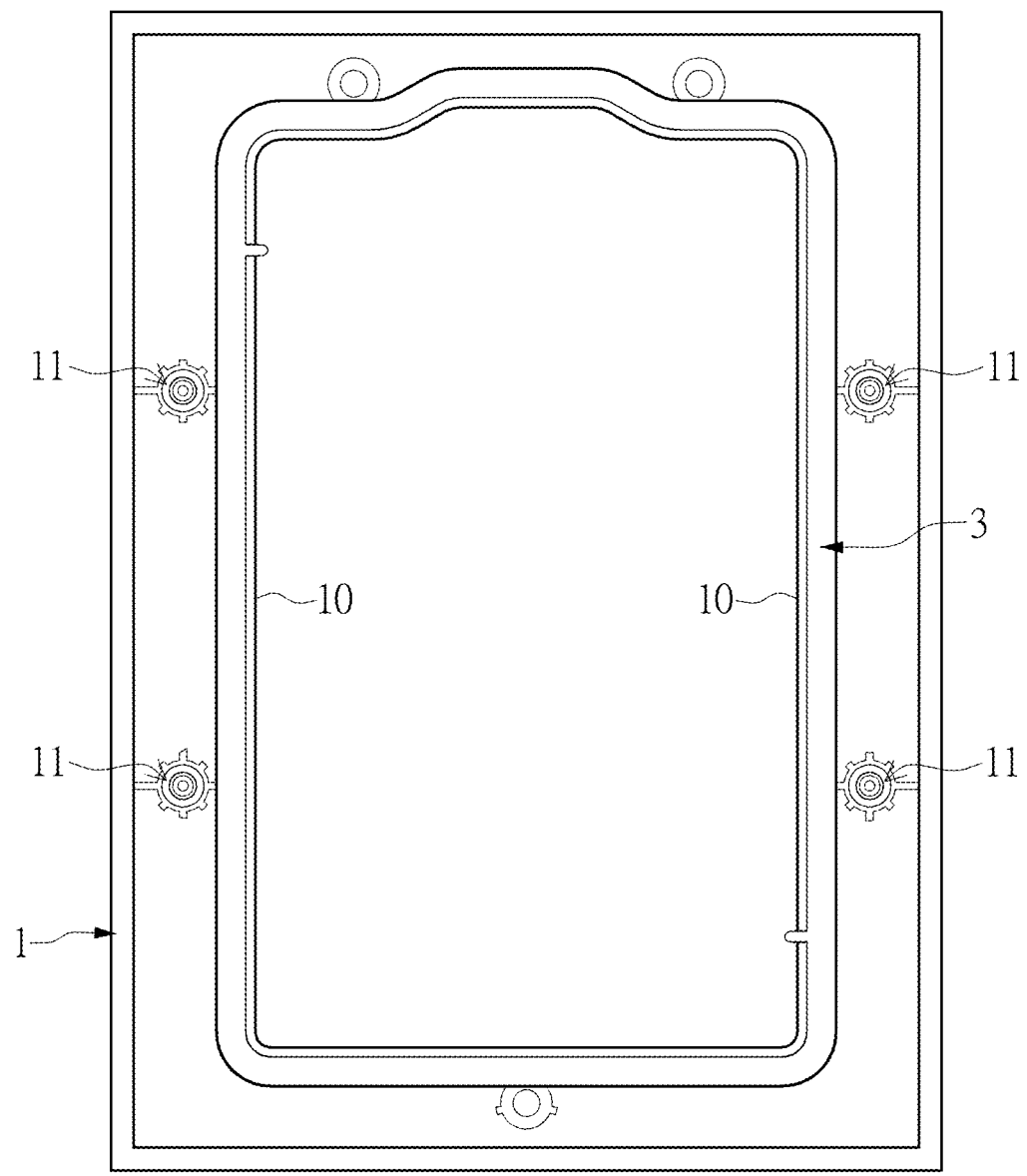
FIG. 4 is a schematic top view of a first housing according to the present disclosure.
Figure 5:
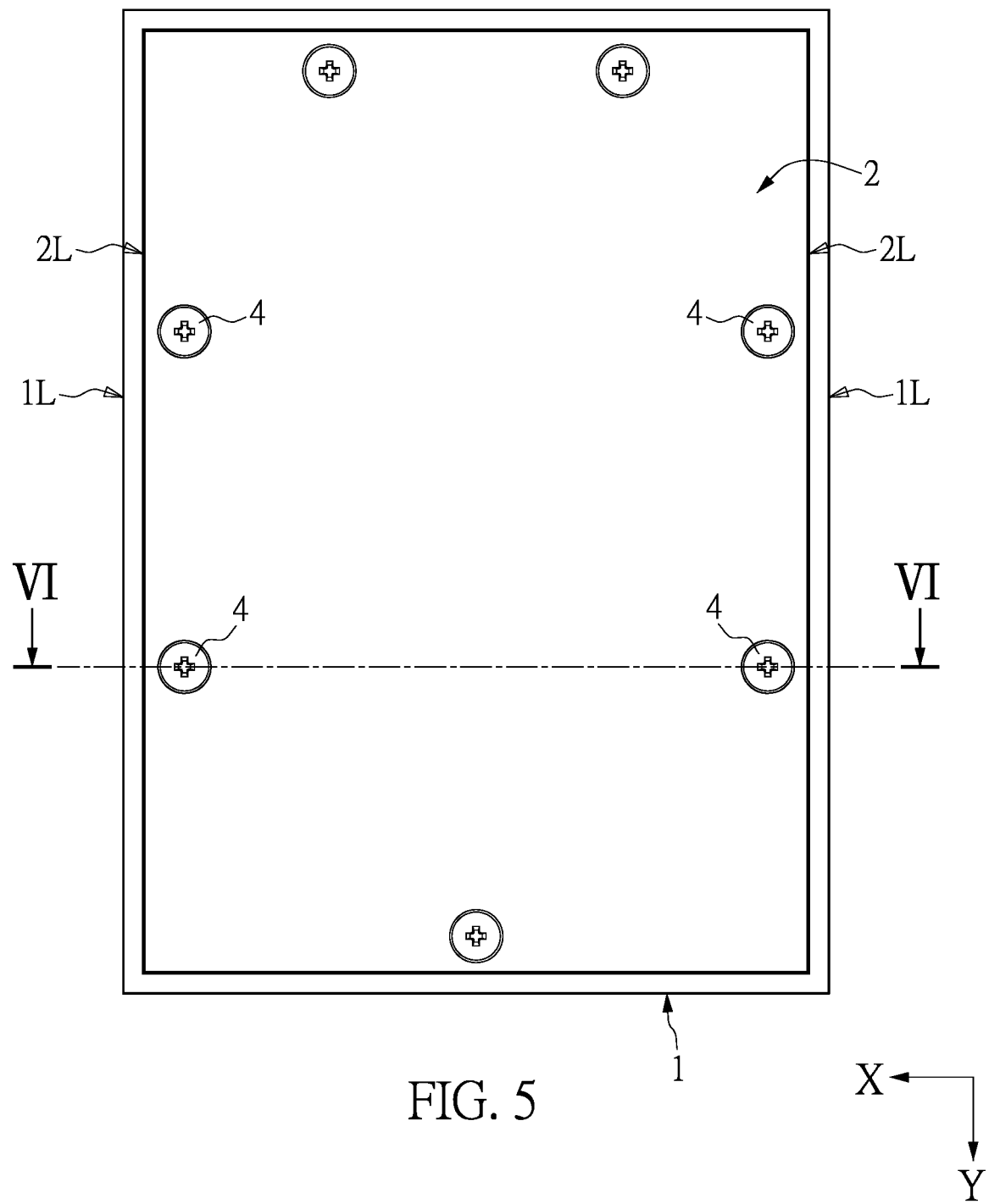
FIG. 5 is a schematic top view of the waterproof device according to the present disclosure.

Referring to FIG. 3 to FIG. 5, FIG. 4 is a schematic top view of a first housing according to the present disclosure, and FIG. 5 is a schematic top view of the waterproof device according to the present disclosure. The first housing 1 further includes an inner wall 10 that is disposed in the first housing 1. As shown in FIG. 4, the at least one first screwing hole 11 is disposed within an accommodating region between the first housing 1 and the inner wall 10. As shown in FIG. 3, the second housing 2 further includes a position limiting wall 20 that is annular in shape, and the position limiting wall 20 is disposed on a surface of the second housing 2 facing the opening S.

Figure 6:
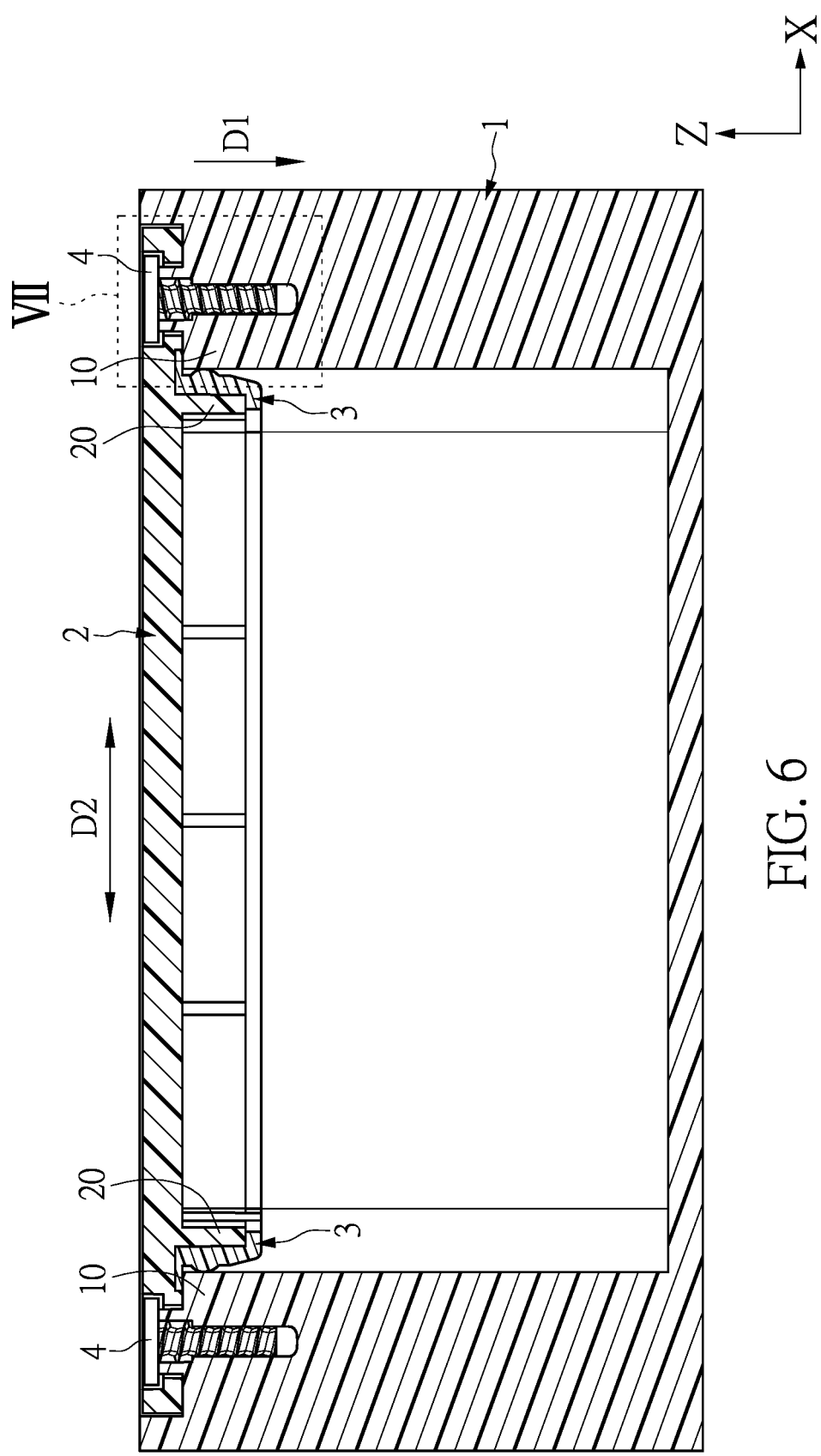
FIG. 6 is a schematic cross-sectional view taken along line VI-VI of FIG. 5.

Referring to FIG. 6, FIG. 6 is a schematic cross-sectional view taken along line VI-VI of FIG. 5. When the second housing 2 covers the opening S of the first housing 1 along a first direction D1, the seal 3 is located between the inner wall 10 and the position limiting wall 20. The position limiting wall 20 of the second housing 2 presses the seal 3 at a periphery of the position limiting wall 20. As shown in FIG. 6, the second housing 2 covers the opening S along the first direction D1 (i.e., the negative Z-axis direction), the position limiting wall 20 laterally presses against the seal 3 along a second direction D2, such that the seal 3 is sandwiched between the first housing 1 and the second housing 2. The first direction D1 is different from the second direction D2. More specifically, the second direction D2 is perpendicular to the first direction D1 and is parallel to an X-axis. For example, in FIG. 6, a right part of the seal 3 is pressed by the position limiting wall 20 along a positive X-axis direction, and a left part of the seal 3 is pressed by the position limiting wall 20 along a negative X-axis direction. Therefore, in the waterproof device M of the present disclosure, the seal 3 is laterally compressed to achieve a waterproof effect.

Figure 7:
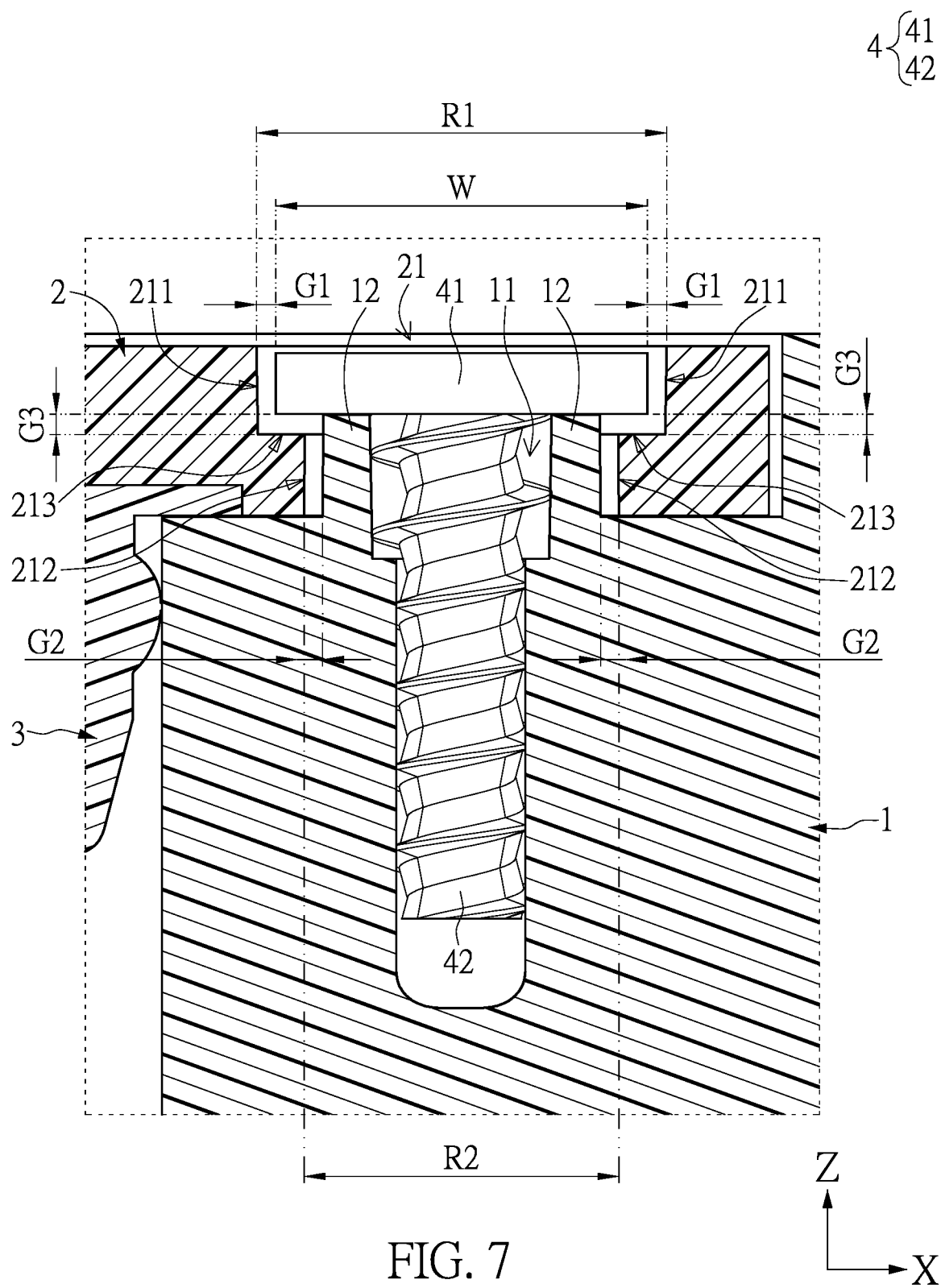
FIG. 7 is a schematic enlarged view of part VII of FIG. 6.

Referring to FIG. 7, FIG. 7 is a schematic enlarged view of part VII of FIG. 6. The at least one second screwing hole 21 includes a first aperture wall 211 and a second aperture wall 212. The at least one locking element 4 includes a head portion 41 and a body portion 42, and the head portion 41 is connected to the body portion 42. The first housing 1 further includes at least one protruding column (e.g., a protruding column having internal threads) 12, and the at least one first screwing hole 11 is formed on the at least one protruding column 12. As shown in FIG. 3, the at least one protruding column 12 has a cylindrical shape. An aperture of the at least one second screwing hole 21 is greater than an aperture of the at least one first screwing hole 11. More specifically, the aperture of the at least one second screwing hole 21 is greater than an outside diameter of the at least one protruding column 12, and the outside diameter of the at least one protruding column 12 is equal to a sum of the aperture of the at least one first screwing hole 11 and twice a wall thickness of the at least one protruding column 12. Therefore, when the second housing 2 covers the opening S of the first housing 1, the at least one protruding column 12 passes through the at least one second screwing hole 21. The body portion 42 of the at least one locking element 4 inserts into the at least one first screwing hole 11 and the head portion 41 abuts against a top of the at least one protruding column 12. Accordingly, the at least one locking element 4 is locked at the at least one first screwing hole 11 of the first housing 1.

The at least one second screwing hole 21 has a first aperture R1 at a position of the first aperture wall 211, and the at least one second screwing hole 21 has a second aperture R2 at a position of the second aperture wall 212. The first aperture R1 is greater than the second aperture R2. A width W of the head portion 41 is greater than the second aperture R2 and is smaller than the first aperture R1. Therefore, the head portion 41 and the first aperture wall 211 have a first gap G1 therebetween. In addition, the at least one protruding column 12 and the second aperture wall 212 have a second gap G2 therebetween. The at least one second screwing hole 21 further includes a third aperture wall 213, and the third aperture wall 213 is connected between the first aperture wall 211 and the second aperture wall 212. The head portion 41 and the third aperture wall 213 have a third gap G3 therebetween. In other words, the at least one protruding column 12 and the second housing 2, and the at least one locking element 4 and the second housing 2 can be not in contact with each other when assembled. The at least one locking element 4 and the at least one protruding column 12 jointly form a position limiting structure for limiting the second housing 2, such that the at least one locking element 4 does not directly clamp the second housing 2 to cause excessive restraint while locking. Therefore, when the first housing 1, the second housing 2, and the seal 3 are deformed with changes in temperature, the second housing 2 can be adequately displaced with the deformation as a result of not being excessively restricted, and the second housing 2 and the seal 3 can maintain a tight fit without affecting the waterproof performance.

Since the at least one locking element 4 does not contact the second housing 20, the locking of the at least one locking element 4 does not cause the first housing 1 and the second housing 2 to generate a normal force or a frictional force therebetween. Moreover, since the first housing 1, the second housing 2, and the at least one locking element 4 have the first gap G1, the second gap G2, and the third gap G3 therebetween, the first housing 1 and the second housing 2 can move relative to each other to a certain extent. Although the at least one locking element 4 does not contact the second housing 2, the second housing 2 cannot be separated from the first housing 1 because the width W of the head portion 41 of the at least one locking element 4 is greater than the second aperture R2. More specifically, although the at least one locking element 4 and the second housing 2 are not in contact with each other along the Z-axis direction, the at least one locking element 4 can limit the second housing 2 in the Z-axis direction.

Figure 8:
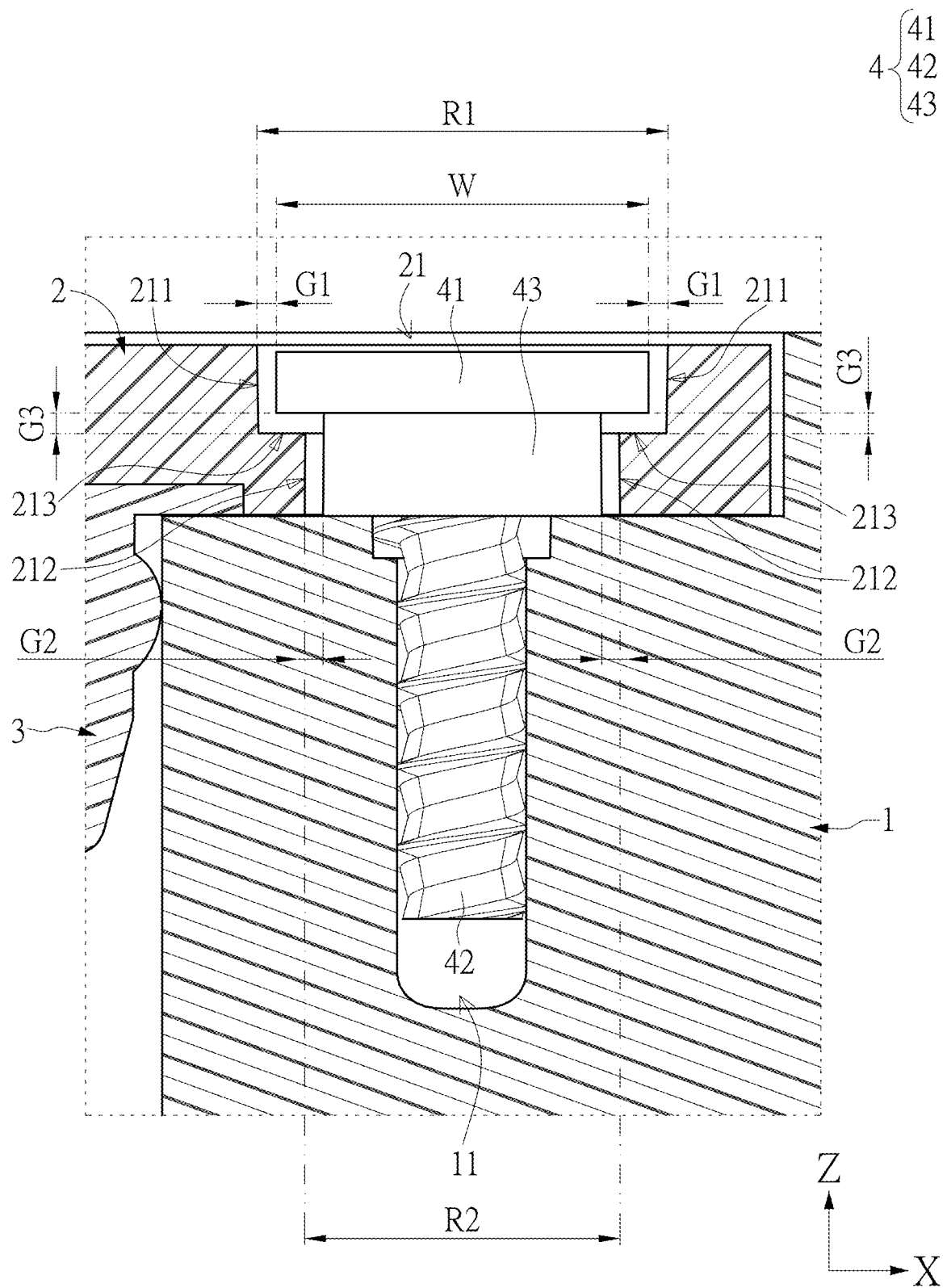
FIG. 8 is a schematic perspective view of a first housing, a second housing, and at least one locking element of the waterproof device according to one embodiment of the present disclosure.

Referring to FIG. 8, FIG. 8 is a schematic perspective view of a first housing, a second housing, and at least one locking element of the waterproof device according to one embodiment of the present disclosure. The locking element 4 includes a head portion 41, a body portion 42, and a neck portion 43. The neck portion 43 is connected between the head portion 41 and the body portion 42. The at least one second screwing hole 21 includes a first aperture wall 211, a second aperture wall 212, and a third aperture wall 213. The third aperture wall 213 is connected between the first aperture wall 211 and the second aperture wall 212. A comparison can be made between FIG. 7 and FIG. 8. In the embodiment of FIG. 8, one or more of the locking element 4 is designed to include the neck portion 43 (i.e., the one or more locking element 4 being a shoulder screw), and the first housing 1 does not have a protruding column structure. When the at least one locking element 4 is locked at the first housing 1 and the second housing 2, the body portion 42 of the at least one locking element 4 inserts into the at least one first screwing hole 11 and the at least one second screwing hole 21, and the neck portion 43 directly abuts against the first housing 1.

Reference is further made to FIG. 8. The at least one second screwing hole 21 has a first aperture R1 at a position of the first aperture wall 211. The at least one second screwing hole 21 has a second aperture R2 at a position of the second aperture wall 212. The first aperture R1 is greater than the second aperture R2. A width W of the head portion 41 is greater than the second aperture R2 and is smaller than the first aperture R1. In addition, the head portion 41 and the first aperture wall 211 have a first gap G1 therebetween, the neck portion 43 and the second aperture wall 212 have a second gap G2 therebetween, and the head portion 41 and the third aperture wall 213 have a third gap G3 therebetween. Therefore, the at least one locking element 4 and the second housing 2 can be not in contact with each other when assembled. The at least one locking element 4 and the neck portion 43 jointly form a position limiting structure for limiting the second housing 2. The at least one locking element 4 can ensure that the first housing 1 and the second housing 2 are not separated from each other after being assembled while the at least one locking element 4 does not directly clamp the second housing 2. Therefore, when the first housing 1, the second housing 2, and the seal 3 are deformed with changes in temperature, the second housing 2 can be adequately displaced with the deformation as a result of not being excessively restricted, and the second housing 2 and the seal 3 can maintain a tight fit without affecting the waterproof performance.

Referring to FIG. 3 to FIG. 5, quantities of the at least one first screwing hole 11, the at least one second screwing hole 21, and the at least one locking element 4 are plural in number. For example, the quantities of the at least one first screwing hole 11, the at least one second screwing hole 21, and the at least one locking element 4 are respectively two. The two first screwing holes 11 are symmetrically disposed on opposite sides of the first housing 1, respectively, and the two second screwing holes 21 are symmetrically disposed on opposite sides of the second housing 2, respectively. The two locking elements 4 respectively pass through the two second screwing holes 21, and the two locking elements 4 are respectively locked at the two first screwing holes 11. However, the quantities of the at least one first screwing hole 11, the at least one second screwing hole 21, and the at least one locking element 4 are not limited in the present disclosure.

Furthermore, the screwing holes and the locking elements in the waterproof device M do not all need to include position limiting structures. As shown in FIG. 3 and FIG. 5, in one preferred embodiment of the present disclosure, an outline of the opening of the first housing 1 has a rectangular shape, and an outline of the second housing 2 also has a rectangular shape. The first housing 1 has two first long sides 1L opposite to each other, and the second housing 2 has two second long sides 2L opposite to each other. Four of the multiple first screwing holes 11 are evenly distributed and oppositely arranged at the two first long sides 1L, and four of the multiple second screwing holes 21 are evenly distributed and oppositely arranged at the two second long sides 2L. Four of the multiple locking elements 4 respectively pass through the four second screwing holes 21 and are respectively locked at the four first screwing holes 11. Accordingly, the position limiting structures of the present disclosure only need to be configured at the positions of the first long side 1L and the second long side 2L. In other words, the four first screwing holes 11 are all formed on the protruding columns 12 (as shown in FIG. 7), or the four locking elements 4 all have neck portions 43 (as shown in FIG. 8).

Beneficial Effects of the Embodiments

In the waterproof device M provided by the present disclosure, by virtue of "the at least one first screwing hole 11 corresponding to the at least one second screwing hole 21, and an aperture of the at least one second screwing hole 21 being greater than an aperture of the at least one first screwing hole 11" and "the at least one locking element 4 passing through the at least one second screwing hole 21 and being locked at the at least one first screwing hole 11," the at least one locking element 4 and the second housing 2 can be not in contact with each other when assembled, so as to avoid deviation of the first housing 1, the second housing 2, and the seal 3 when the at least one locking element 4 is locked.

Further, by way of forming a protruding column 12 on the first housing 1 or using a shoulder screw as the locking element 4 having a neck portion 43, and through the structural design of the aperture of the at least one second screwing hole 21 being greater than the aperture of the at least one first screwing hole 11, the position limiting structure can be formed. Through the structural design of the position limiting structure, the at least one locking element 4 and the second housing 2 have a gap therebetween and are not in contact with each other after being assembled. The at least one locking element 4 does not directly clamp the second housing 2, so as to ensure that the first housing 1 and the second housing 2 are not separated from each other after being assembled while allowing the second housing 2 to have an appropriate displacement. Therefore, when the first housing 1, the second housing 2, and the seal 3 are deformed with changes in temperature, the second housing 2 can be adequately displaced with the deformation as a result of not being excessively restricted, and the second housing 2 and the seal 3 can maintain a good fit without affecting the waterproof performance.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A waterproof device, comprising:
   a first housing having an opening and at least one first screwing hole, and the at least one first screwing hole being disposed at a periphery of the opening;
   a second housing covering the opening along a first direction, wherein the second housing has at least one second screwing hole, the at least one first screwing hole corresponds to the at least one second screwing hole, and an aperture of the at least one second screwing hole is greater than an aperture of the at least one first screwing hole;
   a seal disposed along an edge of the opening, wherein, when the second housing covers the opening, the second housing presses against the seal along a second direction to sandwich the seal between the first housing and the second housing; wherein the first direction is different from the second direction; and
   at least one locking element passing through the at least one second screwing hole and being locked at the at least one first screwing hole, wherein the at least one locking element and the second housing are not in contact with each other.

2. The waterproof device according to claim 1, wherein quantities of the at least one first screwing hole, the at least one second screwing hole, and the at least one locking element are respectively two; wherein the two first screwing holes are symmetrically arranged at two opposite sides of the first housing, respectively, the two second screwing holes are symmetrically arranged at two opposite sides of the second housing, respectively, and the two locking elements respectively pass through the two second screwing holes and are respectively locked at the two first screwing holes.

3. The waterproof device according to claim 1, wherein an outline of the opening of the first housing has a rectangular shape, an outline of the second housing has a rectangular shape, the first housing has two first long sides opposite to each other, and the second housing has two second long sides opposite to each other; wherein of the at least one first screwing hole, the at least one second screwing hole, and the at least one locking element are plural in number, four of the multiple first screwing holes are evenly distributed and oppositely arranged at the two first long sides, four of the multiple second screwing holes are evenly distributed and oppositely arranged at the two second long sides, and four of the multiple locking elements respectively pass through the four second screwing holes and are respectively locked at the four first screwing holes.

4. A waterproof device, comprising:
   a first housing having an opening and at least one first screwing hole, and the at least one first screwing hole being disposed at a periphery of the opening;
   a second housing covering the opening along a first direction, wherein the second housing has at least one second screwing hole, the at least one first screwing hole corresponds to the at least one second screwing hole, and an aperture of the at least one second screwing hole is greater than an aperture of the at least one first screwing hole;
   a seal disposed along an edge of the opening, wherein, when the second housing covers the opening, the second housing presses against the seal along a second direction to sandwich the seal between the first housing and the second housing; wherein the first direction is different from the second direction; and
   at least one locking element passing through the at least one second screwing hole and being locked at the at least one first screwing hole, wherein the at least one second screwing hole includes a first aperture wall and a second aperture wall, the at least one locking element includes a body portion and a head portion, and the head portion is connected to the body portion; wherein the first housing further includes at least one protruding column, the at least one first screwing hole is formed on the at least one protruding column, the at least one protruding column passes through the at least one second screwing hole; wherein the body portion is inserted into the at least one first screwing hole, and the head portion abuts against the at least one protruding column.

5. The waterproof device according to claim 4, wherein the head portion and the first aperture wall have a first gap therebetween, and the at least one protruding column and the second aperture wall have a second gap therebetween.

6. The waterproof device according to claim 2, wherein the at least one second screwing hole further includes a third aperture wall, the third aperture wall is connected between the first aperture wall and the second aperture wall, and the head portion and the third aperture wall have a third gap therebetween.

7. The waterproof device according to claim 4, wherein the at least one second screwing hole has a first aperture at a position of the first aperture wall, the at least one second screwing hole has a second aperture at a position of the second aperture wall, the first aperture is greater than the second aperture, and a width of the head portion is greater than the second aperture.

8. A waterproof device, comprising:
- a first housing having an opening and at least one first screwing hole, and the at least one first screwing hole being disposed at a periphery of the opening;
- a second housing covering the opening along a first direction, wherein the second housing has at least one second screwing hole, the at least one first screwing hole corresponds to the at least one second screwing hole, and an aperture of the at least one second screwing hole is greater than an aperture of the at least one first screwing hole;
- a seal disposed along an edge of the opening, wherein, when the second housing covers the opening, the second housing presses against the seal along a second direction to sandwich the seal between the first housing and the second housing; wherein the first direction is different from the second direction; and
- at least one locking element passing through the at least one second screwing hole and being locked at the at least one first screwing hole, wherein the at least one second screwing hole includes a first aperture wall and a second aperture wall, and the at least one locking element includes a body portion, a head portion, and a neck portion; wherein the neck portion is connected between the body portion and the head portion, the body portion is inserted into the at least one first screwing hole, and the neck portion abuts against the first housing.

9. The waterproof device according to claim 8, wherein the head portion and the first aperture wall have a first gap therebetween, and the neck portion and the second aperture wall have a second gap therebetween; wherein the at least one second screwing hole further includes a third aperture wall, the third aperture wall is connected between the first aperture wall and the second aperture wall, and the head portion and the third aperture wall have a third gap therebetween.

10. The waterproof device according to claim 8, wherein the at least one second screwing hole has a first aperture at a position of the first aperture wall, the at least one second screwing hole has a second aperture at a position of the second aperture wall, the first aperture is greater than the second aperture, and a width of the head portion is greater than the second aperture.

\* \* \* \* \*